United States Patent
Takamura

(10) Patent No.: US 6,809,374 B2
(45) Date of Patent: Oct. 26, 2004

(54) NONVOLATILE MEMORY DEVICE

(75) Inventor: Takashi Takamura, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/392,249

(22) Filed: Mar. 19, 2003

(65) Prior Publication Data

US 2003/0218205 A1 Nov. 27, 2003

(30) Foreign Application Priority Data

Mar. 22, 2002 (JP) ......................................... 2002-081224

(51) Int. Cl.[7] .......................................... H01L 29/768
(52) U.S. Cl. ........................ 257/324; 257/315; 257/316; 257/326
(58) Field of Search ................. 257/311–316, 324–326; 438/257–258, 593

(56) References Cited

U.S. PATENT DOCUMENTS

| | | | |
|---|---|---|---|
| 5,408,115 A | | 4/1995 | Chang |
| 5,422,504 A | | 6/1995 | Chang et al. |
| 5,494,838 A | | 2/1996 | Chang et al. |
| 5,838,041 A | * | 11/1998 | Sakagami et al. .......... 257/324 |
| 5,969,383 A | | 10/1999 | Chang et al. |
| 6,177,318 B1 | | 1/2001 | Ogura et al. |
| 6,248,633 B1 | | 6/2001 | Ogura et al. |
| 6,255,166 B1 | | 7/2001 | Ogura et al. |
| 6,413,821 B1 | | 7/2002 | Ebina et al. |
| 6,518,124 B1 | | 2/2003 | Ebina et al. |
| 2002/0100929 A1 | | 8/2002 | Ebina et al. |
| 2002/0127805 A1 | | 9/2002 | Ebina et al. |
| 2003/0054610 A1 | | 3/2003 | Ebina et al. |
| 2003/0057505 A1 | | 3/2003 | Ebina et al. |
| 2003/0058705 A1 | | 3/2003 | Ebina et al. |
| 2003/0060011 A1 | | 3/2003 | Ebina et al. |

FOREIGN PATENT DOCUMENTS

| | | |
|---|---|---|
| JP | 7-161851 | 6/1995 |
| JP | 2978477 | 9/1999 |
| JP | 2001-102466 | 4/2001 |
| JP | 2001-148434 | 5/2001 |
| JP | 2001-156188 | 6/2001 |

OTHER PUBLICATIONS

Yutaka Hayashi, et al., "Twin MONOS Cell with Dual Control Gates", 2000, IEEE VLSI Technology Digest.
Kuo–Tung Chang, et al., "A New SONOS Memory Using Source–Side Injection for Programming", IEEE Electron Device Letters, vol. 19, No. 7, Jul. 1998, pp. 253–255.
Wei Ming Chen, et al., "A Novel Flash Memory Device with S Plit Gate Source Side Injection an ONO Charge Storage Stack (SPIN)", 1997, VLSI Technology Digest, pp. 63–64.

* cited by examiner

Primary Examiner—Dung A. Le
(74) Attorney, Agent, or Firm—Michael T. Gabrik

(57) ABSTRACT

To match where electrons are injected when writing and where holes are injected when erasing in a MONOS-type nonvolatile memory device, two control gates are formed between a word gate on respective intervening ONO gate insulation layers which, in turn, are formed on a substrate. The third layers (silicon oxide layer) are absent over respective portions of the second layers along the lengths of the second gate insulation layers to form shoulders. The electron injection position when writing and the hole injection position when erasing can thus be confined to the neighborhood of the shoulder(s) where the third layer is removed.

11 Claims, 4 Drawing Sheets

NONVOLATILE MEMORY DEVICE

BACKGROUND OF THE INVENTION

1. Field of the Invention

The present invention relates generally to a nonvolatile memory device, and relates more specifically to an improved metal-oxide-nitride-oxide-semiconductor (MONOS) memory device.

2. Description of the Related Art

One type of nonvolatile memory device is the metal-oxide-nitride-oxide-semiconductor (MONOS) memory device. One characteristic of a MONOS memory device is that the gate insulation layer between the channel region and control gate is a silicon oxide-silicon nitride-silicon oxide layer, and electric charges are trapped in the silicon oxide layer.

FIG. 6 is a partial sectional drawing of a MONOS type nonvolatile memory device according to the related art. In a MONOS type memory cell 100 the source region 101a and drain region 101b are formed in the semiconductor substrate 101 separated by a channel formation region disposed therebetween. A control gate (CG) 103 is formed over the channel region through an intervening gate insulation layer 104. The gate insulation layer 104 has three layers, a first layer 104a that is a silicon oxide layer formed on the semiconductor substrate 101, a second layer 104b that is a silicon nitride layer formed on the first layer 104a, and a third layer 104c that is a silicon oxide layer formed on the second layer 104b. The gate insulation layer 104 is structured to have a trap level in the second layer 104b.

With this memory device, electrons hopping into the first layer 104a are trapped at the trap level of the second layer 104b. Electrons that enter and are trapped at the trap level cannot easily escape from the trap level, and thus stabilize.

Because electrons, or more specifically negatively charged particles, are held in the gate insulation layer 104, and more precisely in the second layer 104b, at this time, the threshold value of the gate insulation layer 104 rises compared with the initial level. Whether or not data was written is determined by detecting change in this threshold value, and operation as a memory device is thus achieved.

Japanese Patent Laid-Open Publications (kokai) 2001-102466 and 2001-148434, and U.S. Pat. No. 6,255,166B1 teach a nonvolatile memory device of a so-called "split gate" type as an improvement of this MONOS type memory device.

FIG. 7 shows a split-gate nonvolatile memory device according to the related art. The nonvolatile memory device shown in FIG. 6 stores one bit of data in one memory cell, but the split-gate memory device shown in FIG. 7 can store two bits of data in one memory cell.

In FIG. 7 a first impurity region (n-type) 201a and a second impurity region (n-type) 201b are formed in a p-type semiconductor substrate 201 separated by a channel formation region therebetween. This split gate memory cell 200 has a word gate (denoted "WG" in the figures) 203 formed on the semiconductor substrate 201 through an intervening first gate insulation layer 202. A first control gate (denoted "LCG" in the figures) 204 and a second control gate (denoted "RCG" in the figures) 205 are formed as sidewalls on opposite sides of the word gate WG 203. A second gate insulation layer 206a is disposed between the bottom of the first control gate LCG 204 and semiconductor substrate 201. A first side insulation layer 207a is disposed between the side of first control gate LCG 204 and word gate WG 203. A third gate insulation layer 206b is likewise disposed between the bottom of second control gate RCG 205 and the semiconductor substrate 201, and a second side insulation layer 207b is disposed between the side of second control gate RCG 205 and the word gate WG 203.

The second and third gate insulation layers 206a and 206b, and the first and second side insulation layers 207a and 207b have three layers, a first layer that is a silicon oxide layer formed on the semiconductor substrate 201, a second layer that is a silicon nitride layer formed on the first layer, and a third layer that is a silicon oxide layer formed on the second layer.

Compared with the memory device shown in FIG. 6, the split gate memory device shown in FIG. 7 is more complex structurally, but is a symmetrical structure that can record two bits.

Writing to the above split gate memory device is described first below using by way of example for simplicity writing to the second control gate RCG 205 side of this memory cell 200.

A specific voltage is applied to the second impurity region (drain region) 201b, word gate WG 203, first control gate LCG 204, and second control gate RCG 205. Of the electrons that move from the first impurity region (source region) 201a to the drain region 201b, the hot electrons, that is, the electrons with high kinetic energy, hop into the third gate insulation layer 206b due to the voltage applied to the second control gate RCG 205, and data is thus written.

Erasing data is accomplished as follows. By applying a specific voltage to the drain region 201b and second control gate RCG 205, a hole is created by the tunnel effect in the neighborhood of the channel formation region of the drain region 201b. This hole is a hot hole, that is, a hole trapping high kinetic energy, and jumps into the third gate insulation layer 206b. If an electron is trapped at the trap level in the silicon nitride layer (second layer) at this time, the electron and hole couple and die. That is, the charge is depleted and the initial state is restored. This is called the BBH (band-to-band) tunneling hole erasing mechanism, i.e., a method of erasing by band-to-band tunneling.

The initial state is restored as a result of electron-hole bonding as described above, but it is important to note that in order for this to happen the electron and hole must be injected to the same spatial location. This is because the silicon nitride layer is an insulator and the carriers (electron and hole) cannot move through the silicon nitride layer structure and bond again.

Writing with a hot electron occurs near the word gate WG 203 in the split gate memory device shown in FIG. 7.

Erasing by means of the BBH erase mechanism, however, occurs at the edge of the drain, that is, near the edge part of the drain region 201b.

In other words, even if the total charge trapped at the trap level in the silicon nitride layer of the device shown in FIG. 7 is 0, residual positive and negative charges remain stored in a charge trapping region. Furthermore, because a charge causing these charges to cancel each other out is not supplied, they gradually increase through repeated write and erase cycles.

When an unbalanced charge thus remains internally, there is a significant drop in the mutual conductance of the MOS transistors. Furthermore, this is a significant problem with respect to the structure of rewritable memory because this drop in conductance changes as the write and erase cycles repeat.

OBJECTS AND SUMMARY OF THE INVENTION

To solve this problem a nonvolatile memory device according to one aspect of the present invention has first and second impurity regions formed in a substrate with a channel region therebetween; a word gate formed above the channel region with a first gate insulation layer therebetween; a first control gate formed to one side of the word gate with a first side insulation layer therebetween; a second control gate formed to another side of the word gate with a second side insulation layer therebetween; a second gate insulation layer having a charge trapping region formed between the substrate and the first control gate; and a third gate insulation layer having a charge trapping region formed between the substrate and second control gate. With this configuration, the magnitude of an electric field applied in a direction substantially orthogonal relative to the substrate surface between the substrate and first control gate is lower within a first, range in the gate length direction adjacent the first side insulation layer than it is within a second range in the gate length direction closer to the first impurity region.

Preferably, the magnitude of an electric field applied in a direction orthogonal relative to the substrate surface between the substrate and second control gate is lower within a third range (e.g., within L1) in the gate length direction adjacent the second side insulation layer than it is within a fourth range (e.g., within L3) in the gate length direction closer to the second impurity region.

A nonvolatile memory device according to another aspect of the invention has first and second impurity regions formed in a substrate with a channel region therebetween; a word gate formed above the channel region with a first gate insulation layer therebetween; a first control gate formed to one side of the word gate with a first side insulation layer therebetween; a second control gate formed to another side of the word gate with a second side insulation layer therebetween; a second gate insulation layer having a charge trapping region formed between the substrate and the first control gate; and a third gate insulation layer having a charge trapping region formed between the substrate and second control gate. In this configuration, the film thickness of the second gate insulation layer is thicker within a first range in the gate length direction adjacent the first side insulation layer than it is within a second range in the gate length direction closer to the first impurity region.

Preferably in this case the film thickness of the third gate insulation layer is thicker within a third range in the gate length direction adjacent the second side insulation layer than it is within a fourth range in the gate length direction closer to the second impurity region.

A nonvolatile memory device according to a another aspect of the invention has first and second impurity regions formed in a substrate with a channel region therebetween; a word gate formed above the channel region with a first gate insulation layer therebetween; a first control gate formed to one side of the word gate with a first side insulation layer therebetween; a second control gate formed to another side of the word gate with a second side insulation layer therebetween; a second gate insulation layer having a charge trapping region formed between the substrate and the first control gate; and a third gate insulation layer having a charge trapping region formed between the substrate and second control gate. In this configuration the second gate insulation layer is a multiple layer film having a silicon nitride layer disposed between top and bottom silicon oxide layers, the silicon nitride layer of the second gate insulation layer being in contact with the first control gate within a first range in the gate length direction in proximity to the first impurity region.

Preferably in this case the third gate insulation layer is a multiple layer film having a silicon nitride layer disposed between top and bottom silicon oxide layers, the silicon nitride layer of the third gate insulation layer being in contact with the second control gate within a second range in a gate length direction in proximity to the second impurity region.

A nonvolatile memory device according to a further aspect of the invention has first and second impurity regions formed in a substrate with a channel region therebetween; a word gate formed above the channel region with a first gate insulation layer therebetween; a control gate formed to one side of the word gate with a side insulation layer therebetween; and a second gate insulation layer having a charge trapping region formed between the substrate and the control gate. The magnitude of the electric field applied in a direction substantially orthogonal relative to the substrate surface between the substrate and control gate is lower within a first range in the gate length direction adjacent the side insulation layer than it is within a second range in the gate length direction closer to the second impurity region.

A nonvolatile memory device according to a still further aspect of the invention has first and second impurity regions formed in a substrate with a channel region therebetween; a word gate formed above the channel region with a first gate insulation layer therebetween; a control gate formed to one side of the word gate with a side insulation layer therebetween; and a second gate insulation layer having a charge trapping region formed between the substrate and the control gate. The film thickness of the second gate insulation layer is thicker within a first range in the gate length direction adjacent the side insulation layer than it is within a second range in the gate length direction closer to the first impurity region.

A nonvolatile memory device according to another aspect of the invention has first and second impurity regions formed in a substrate with a channel region therebetween; a word gate formed above the channel region with a first gate insulation layer therebetween; a control gate formed to one side of the word gate with a side insulation layer therebetween; and a second gate insulation layer having a charge trapping region formed between the substrate and the control gate. The second gate insulation layer is a multiple layer film having a silicon nitride layer disposed between top and bottom silicon oxide layers, the silicon nitride layer of the second gate insulation layer being in contact with the control gate in a range in the gate length direction in proximity to the second impurity region.

A nonvolatile memory device according to yet another aspect of the invention has first and second impurity regions formed in a substrate with a channel region therebetween; and a control gate formed above the channel region with a gate insulation layer therebetween. The electric field applied in a direction substantially orthogonal relative to the substrate surface between the substrate and control gate is lower within a middle region in the gate length direction of the control gate than it is in regions closer to the first and second impurity regions.

A nonvolatile memory device according to still another aspect of the invention has first and second impurity regions formed in a substrate with a channel region therebetween; and a control gate formed above the channel region with a gate insulation layer therebetween. The gate insulation layer is a multiple layer film having a silicon nitride layer disposed between top and bottom silicon oxide layers, the silicon nitride layer of the second gate insulation layer being in contact with the control gate in proximity to the first and second impurity regions.

Thus comprised, the invention provides a MONOS type nonvolatile memory device capable of withstanding repeated write/erase cycles.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Embodiment 1

Figure 1:
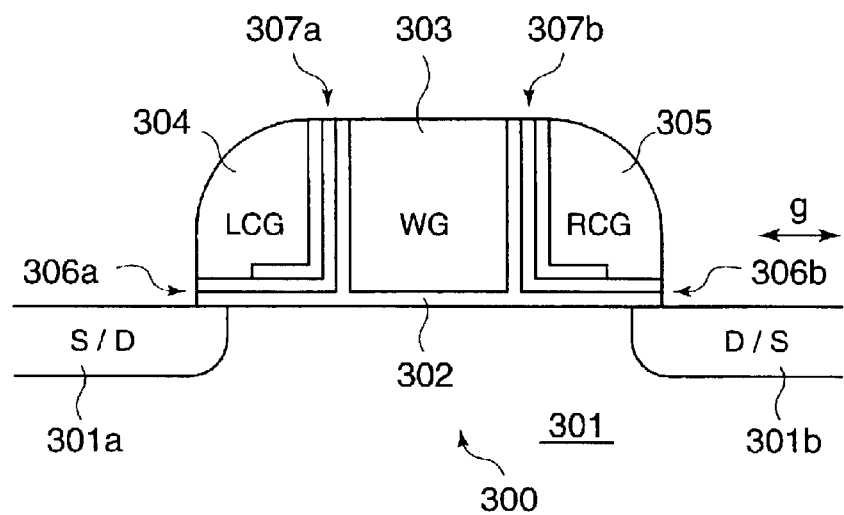
FIG. 1 shows a partial sectional view of a split gate memory device according to a first embodiment of the present invention.

FIG. 1 is a partial sectional view of a split gate memory device according to a first embodiment of the present invention for storing two data bits using one word gate.

In a memory cell 300 as shown in FIG. 1 a first impurity region (n-type) 301a and a second impurity region (n-type) 301b, one of which functions as a source region and the other as a drain region, are formed in a p-type semiconductor substrate 301 separated by a channel region therebetween.

A word gate (WG) 303 is formed over the channel region with a first gate insulation layer 302 disposed therebetween. A first control gate 304 (denoted "LCG" in the figures) and a second control gate 305 (denoted "RCG" in the figures) are formed as sidewalls on opposite sides of the word gate 303. That the control gates are formed as sidewalls here means that the sectional shape of the control gates is the same as the sectional structure of the sidewall insulation layers in a conventional MOS transistor.

A second gate insulation layer 306a is disposed between the bottom of first control gate LCG 304 and semiconductor substrate 301. A first side insulation layer 307a is disposed between the side of first control gate LCG 304 and word gate WG 303. Likewise, a third gate insulation layer 306b is disposed between the bottom of second control gate RCG 305 and semiconductor substrate 301, and a second side insulation layer 307b is disposed between the side of second control gate RCG 305 and word gate WG 303.

The second and third gate insulation layers 306a, 306b have three layers comprising a first layer of silicon oxide formed on the semiconductor substrate 301, a second layer of silicon nitride formed on the first layer, and a third layer of silicon oxide formed on the second layer. Gate insulation layers 306a, 306b are thus ONO films. Side insulation layers 307a, 307b may also be ONO films, but since they simply need to insulate the word gate 303 from the control gates 304, 305, they need not be. Side insulation layers 307a, 307b could, for example, be a single silicon oxide layer, or a multiple layer construction of silicon oxide and silicon nitride layers.

The second and third gate insulation layers 306a, 306b have a charge trapping region (trap level) in the silicon nitride second layer.

Figure 2:
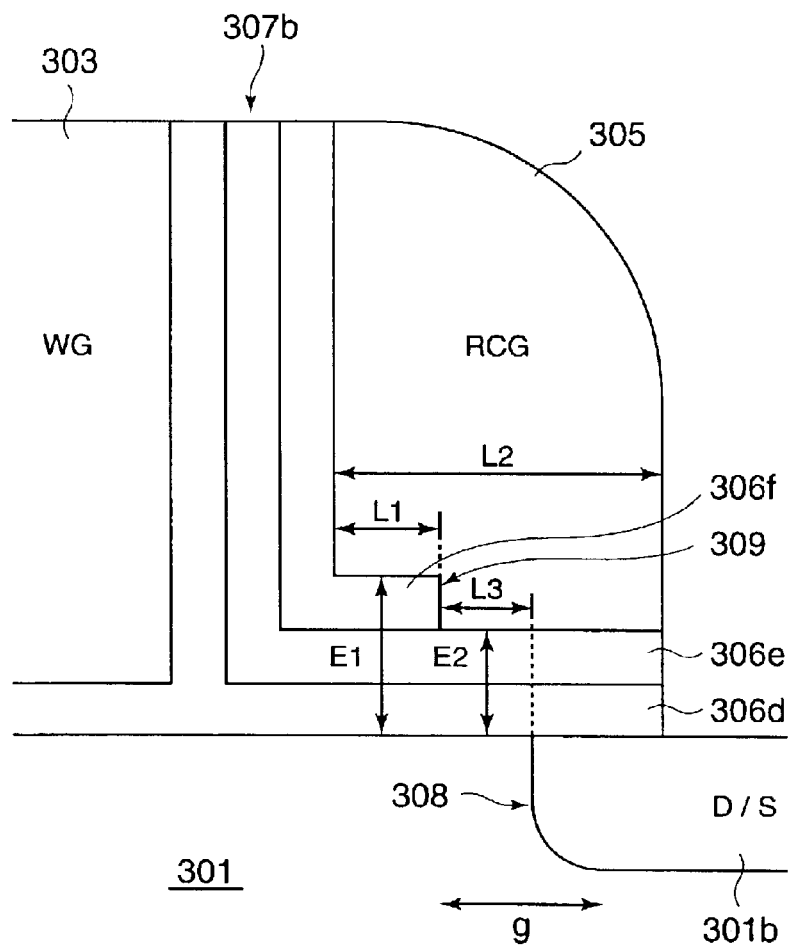
FIG. 2 is an enlarged partial sectional view of a split gate memory device according to the first embodiment.

The silicon oxide third layer of each gate insulation layer 306a, 306b is made shorter than the corresponding silicon nitride second layer in the gate length direction indicated by arrow g shown in FIG. 2. More specifically, the top of the second layer is covered by a third layer near the side of word gate WG 303. However, the top of the second layer is not covered by the third layer in either of the areas near the first and second impurity regions 301a, 301b. Thus, a portion of the second layers contact the bottom of the first control gate LCG 304 and the bottom of the second control gate RCG 305 respectively. In other words, part of each third layer is removed to provide a step in the ONO films.

This is described more specifically with reference to FIG. 2, which is an enlarged partial section view showing the difference in the length of each layer in the gate length direction g of the ONO film.

In the gate length direction g, the length of a first layer 306d is the same as the length of a second layer 306e. That length is designated by L2. The length L1 of a third layer 306f is shorter than that of the first and second layers 306d, 306e (i.e., L2>L1). The distance between an edge 308 of the second impurity region 301b and an edge 309 of the third layer 306f in the gate length direction g is length L3.

Write and erase operations using this memory cell structure is described next below.

The write operation is described first using by way of example writing to the second control gate RCG 305 side of this memory cell 300. It should be noted that because this memory cell is symmetrically constructed writing to the first control gate LCG 304 can be achieved by symmetrically reversing the voltages applied to the elements.

A sufficiently high voltage, such as 3 V, is first applied to the first control gate LCG 304. A voltage slightly higher than a threshold value is then applied to the word gate WG 303. If this threshold value is 0.5 V, for example, a voltage of approximately 1 V is applied. A voltage sufficient to accelerate the electrons, such as 5 V, is then applied to the second impurity region 301b. A voltage higher than that applied to the second impurity region 301b, such as 6 V, is then applied to the second control gate RCG 305.

Current flow to the device in this state can be controlled up to the current level limited by the word gate WG 303, such as approximately 10 µA.

An extremely strong inversion layer, that is, a deep inversion layer, is formed proximally to the second impurity region 301b in the channel region below the second control gate RCG 305 at this time. This is because the third layer 306f is not present in the between edges 308 and 309. Electron conductivity in this inversion layer is extremely high. In other words, the state of the channel region below the second control gate RCG 305 and proximal to the second impurity region 301b can be considered substantially equivalent to the second impurity region 301b.

Hot electrons thus exist in proximity to the region where the thickness of the third gate insulation layer 306b varies, and data is written using this area.

The electric field acting in a direction substantially orthogonal to the surface of the semiconductor substrate 301 between the second control gate RCG 305 and semiconductor substrate 301 is considered next. Let E1 be the portion of the electric field within the range of length L1 where the third gate insulation layer 306b consists of three insulation layers, and let E2 be the portion of the electric field within the range of length L3 where the third gate insulation layer 306b consists of two insulation layers. Comparing E1 and E2, E2 is greater than E1. This is because the electric field is proportional to the potential difference/square of the distance. Thus, the field strength increases where the film thickness is thin, that is, where the distance is short, if the potential difference is the same. In other words, the magnitude of the electric field orthogonal to the control gate and semiconductor substrate differs along the direction of carrier movement in this device.

The hot carrier electrons thus have peak kinetic energy near where the thickness of the third gate insulation layer 306b changes, and are trapped in the second layer 306e (carrier trap) as though pulled by the second control gate RCG 305. Data is thus written to the memory cell.

Figure 3:
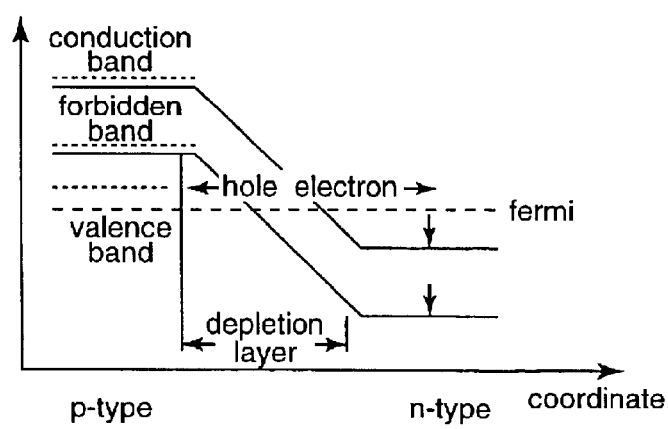
FIG. 3 illustrates an erase mechanism in accordance with the first embodiment.

The erase operation is described next with reference to FIG. 3, which is a band diagram showing the state of the p-n junction part near edge 308 of the second impurity region 301b, with the potential energy of the electrons shown on the vertical axis and the actual spatial coordinates on the horizontal axis.

A high positive voltage of 5 V, for example, is first applied to the second impurity region 301b, and a negative voltage of −5 V, for example, is applied to the second control gate RCG 305.

This results in a drop in the potential energy of electrons in the n-type second impurity region 301b. (In FIG. 3 the potential energy of electrons in the n-type region shifts in the direction of the arrows.) Because the thickness of the depletion layer is extremely thin at several nm in this high concentration p-n junction, electrons in the p-type valence band can move by the tunnel effect to the n-type conduction band. In other words, holes occur in proximity to the edge 308 of the p-type second impurity region 301b in conjunction with electron movement. This means that a hole accumulation layer is formed near the edge 308.

The electric field in the region within the range of length L3 where the third gate insulation layer consists of two layers, and in the region within the range of length L1 where it has three layers, is considered next. Carrier conductivity is high where there are two layers because of the hole accumulation layer that is formed. The electric field in the horizontal direction (gate length direction g) is therefore relatively small. Furthermore, because the film thickness of the gate insulation layer is thin, the electric field in the orthogonal direction is relatively large. Holes occurring near the edge 308 therefore cannot hop into the two-layer part of the gate insulation layer.

In the three-layer part of the gate insulation layer, however, the electric field is relatively large in the horizontal direction and relatively small orthogonally thereto. Holes occurring near the edge 308 therefore have much energy in the border area between the two-layer and three-layer areas, and thus hop into the third gate insulation layer 306b. More specifically, holes are injected proximally to the area where the thickness of the third gate insulation layer 306b changes, and data is erased from this area.

The position where electrons are injected when writing and the position where holes are injected when erasing can thus be aligned in the silicon nitride second layer 306e. As a result, a memory device that does not deteriorate with repeated write/erase cycles can be achieved.

The individual layers of the second and third gate insulation layer films are considered next.

The first and third silicon oxide layers must be at least 25 angstroms thick. This is because the direct tunnel effect is particularly pronounced when the film thickness is less than 25 angstroms, charges can therefore escape to the gate electrode or semiconductor substrate at room temperature, and it is difficult to assure acceptable performance for a memory device.

Because the charge accumulates at the trap level at the interface to the silicon nitride second layer, a thickness of only one atom is theoretically sufficient. However, if an oxidation environment of nearly 800° C. is used to form the silicon oxide layer formed over the silicon nitride layer, the oxidizing agent will pass through the silicon nitride layer and modify the lower silicon oxide layer if the silicon nitride layer is less than 20 angstroms thick. A film thickness of 20 angstroms or more is therefore necessary.

The total thickness of the second and third insulation layers is considered next.

A voltage of approximately 8 V is applied to the gate insulation layer during the erase operation. Because this field is applied only for the short time needed for erasing, the overall thickness of the gate insulation layer film must be at least approximately 60 angstroms at the thinnest part to withstand approximately 15 MV/cm.

However, if the film thickness at the thickest part of the gate insulation layer is too thick, the threshold value in this area becomes too high and current will not flow even during the erase operation. The film thickness of the gate insulation layer is therefore preferably 250 angstroms or less.

Variation of the First Embodiment

Figure 4:
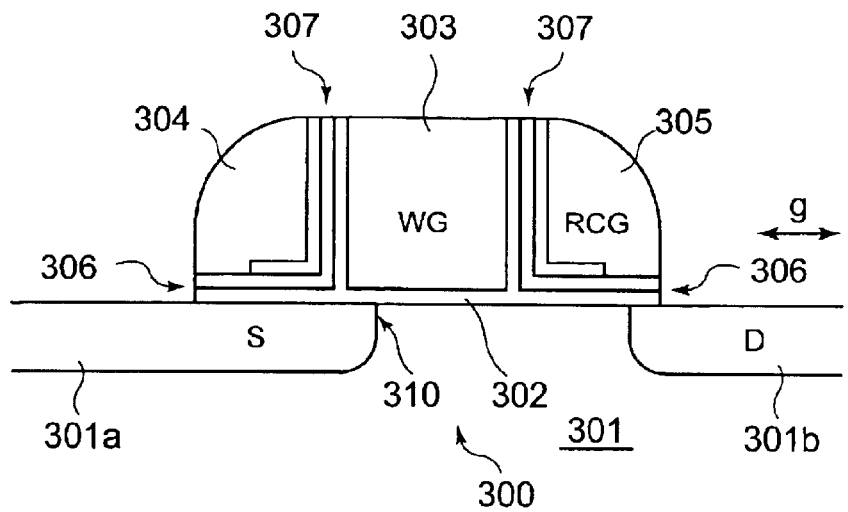
FIG. 4 shows a split gate memory device construction in accordance with a variation of the first embodiment of the invention.

A memory device according to a variation of the first embodiment is shown in FIG. 4, which is a partial sectional view of a variation of the memory device according to the first embodiment shown in FIG. 1.

Like parts in FIG. 4 and the configuration shown in FIG. 1 and FIG. 2 are identified by like reference numerals and further description thereof is omitted below where only the differences between the first embodiment and this variation are described.

This embodiment differs from the above first embodiment in that a control gate is formed on only one side of the word gate. As will be understood by comparison with FIG. 1, this configuration has only the second control gate RCG 305; the first control gate LCG is not formed. A sidewall insulation layer 304 is formed on the left side in the device shown in FIG. 4. In addition, the first impurity region 301a is extended so that an edge 310 thereof is below the word gate WG 303 when the position of the edge 310 is projected onto the semiconductor substrate 301. The advantage of this configuration is that because there is a control gate on only one side control is simpler compared with having a control gate on each side.

As described above, the write/erase positions can be aligned to a same predetermined position with this variation of the invention, and a memory device that does not suffer from degraded performance through repeated write/erase cycles can be achieved.

Embodiment 2

A nonvolatile memory device according to a second embodiment of the present invention is described next.

Figure 5:
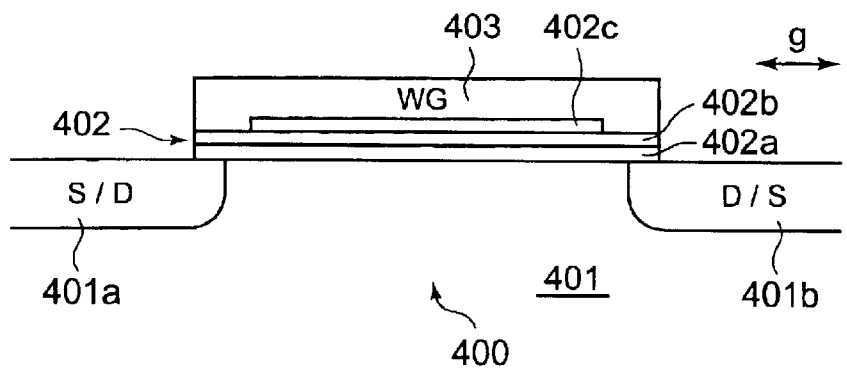
FIG. 5 shows a partial sectional view of a split gate memory device according to a second embodiment of the present invention.
Figure 6:
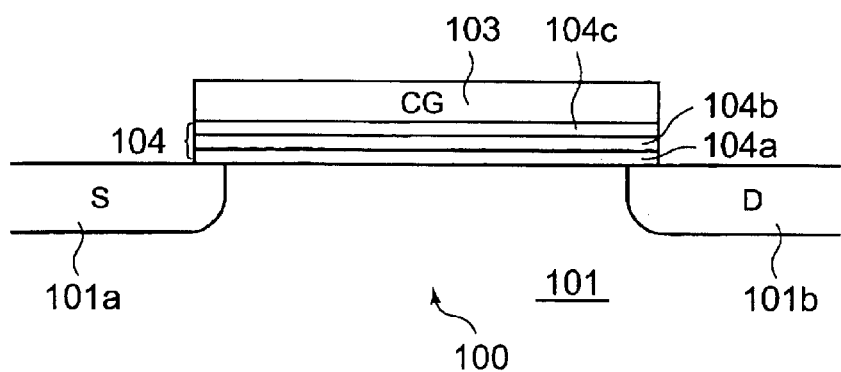
FIGS. 6 and 7 each show a partial sectional view of a known memory device.
Figure 7:
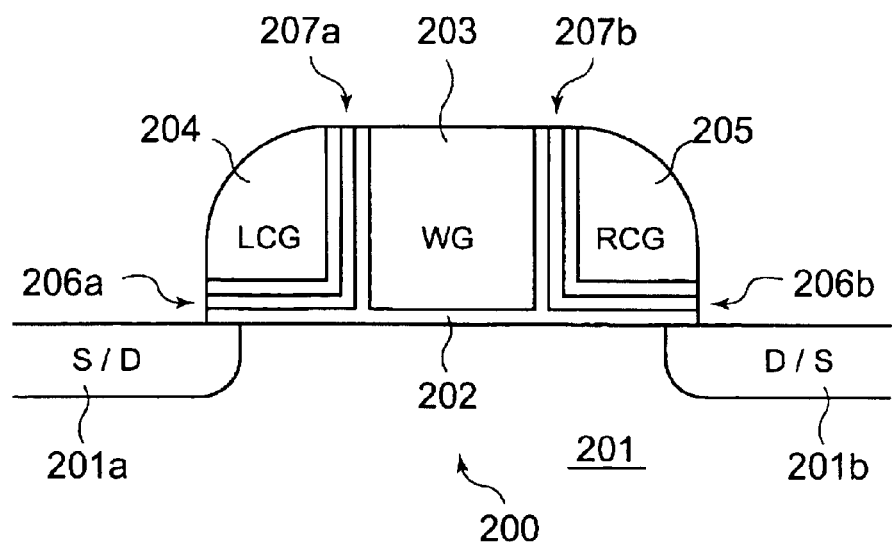

FIG. 5 is a partial sectional view showing the configuration of a nonvolatile memory device according to a second embodiment of the present invention.

As shown in FIG. 5, this memory cell 400 has a first impurity region (n-type) 401a and a second impurity region (n-type) 401b, one of which forms a source region and the other a drain region, in a p-type semiconductor substrate 401 separated by a channel region therebetween.

A word gate WG 403 is formed above the channel region with a first gate insulation layer 402 therebetween.

The first gate insulation layer 402 has three layers, a silicon oxide first layer 402a formed on the semiconductor substrate 401, a silicon nitride second layer 402b formed on the first layer, and a silicon oxide third layer 402c formed on the second layer.

The silicon oxide third layer 402c is disposed over the middle portion of the second layer 402b in the gate length direction g, thereby forming a pair of shoulders, one on each side, in the ONO gate insulation layer 402.

As in the above first embodiment, the write/erase positions can be localized in the neighborhood of this shoulder in the present embodiment, and a memory device that does not deteriorate through repeated write/erase cycles can be provided.

A memory cell thus configured can store two data bits because data can be stored in the second layer 402b near both of these shoulders.

While the invention has been described in conjunction with two specific embodiments, further alternatives, modifications, variations and applications will be apparent to those skilled in the art in light of the foregoing description. For example, an SOI semiconductor layer could be used as the semiconductor layer instead of the bulk semiconductor substrate described in the above embodiments. Thus, the invention described herein is intended to embrace all such alternatives, modifications, variations and applications as may fall within the spirit and scope of the appended claims.

What is claimed is:

1. A nonvolatile memory device, comprising:
   a first impurity region and a second impurity region each formed in a substrate;
   a channel region between the first and second impurity regions;
   a word gate formed above the channel region;
   a first gate insulation layer between the word gate and the channel region;
   a first control gate formed to one side of the word gate;
   a first side insulation layer between the first control gate and the word gate;
   a second control gate formed to another side of the word gate;
   a second side insulation layer between the second control gate and the word gate;
   a second gate insulation layer having a first charge trapping region formed between the substrate and the first control gate; and
   a third gate insulation layer having a second charge trapping region formed between the substrate and second control gate;
   wherein the magnitude of an electric field applied in a direction substantially orthogonal relative to the substrate surface between the substrate and the first control gate is lower within a first range in a gate length direction adjacent the first side insulation layer than it is within a second range in the gate length direction closer to the first impurity region.

2. A nonvolatile memory device as described in claim 1, wherein the magnitude of an electric field applied in a direction substantially orthogonal relative to the substrate surface between the substrate and the second control gate is lower within a third range in the gate length direction adjacent the second side insulation layer than it is within a fourth range in the gate length direction closer to the second impurity region.

3. A nonvolatile memory device, comprising:
   a first impurity region and a second impurity region each formed in a substrate;
   a channel region between the first and second impurity regions;
   a word gate formed above the channel region;
   a first gate insulation layer between the word gate and the channel region;
   a first control gate formed to one side of the word gate;
   a first side insulation layer between the first control gate and the word gate;
   a second control gate formed to another side of the word gate;
   a second side insulation layer between the second control gate and the word gate;
   a second gate insulation layer having a first charge trapping region formed between the substrate and the first control gate; and
   a third gate insulation layer having a second charge trapping region formed between the substrate and second control gate;
   wherein a film of the second gate insulation layer is thicker within a first range in a gate length direction adjacent the first side insulation layer than it is within a second range in the gate length direction closer to the first impurity region.

4. A nonvolatile memory device as described in claim 3, wherein a film of the third gate insulation layer is thicker within a third range in the gate length direction adjacent the second side insulation layer than it is within a fourth range in the gate length direction closer to the second impurity region.

5. A nonvolatile memory device, comprising:
   a first impurity region and a second impurity region each formed in a substrate;
   a channel region between the first and second impurity regions;
   a word gate formed above the channel region;
   a first gate insulation layer between the word gate and the channel region;
   a first control gate formed to one side of the word gate;
   a first side insulation layer between the first control gate and the word gate;
   a second control gate formed to another side of the word gate;
   a second side insulation layer between the second control gate and the word gate;
   a second gate insulation layer having a first charge trapping region formed between the substrate and the first control gate; and
   a third gate insulation layer having a second charge trapping region formed between the substrate and second control gate;
   wherein the second gate insulation layer comprises a multiple layer film including a silicon nitride layer disposed between top and bottom silicon oxide layers, the silicon nitride layer of the second gate insulation layer being in contact with the first control gate within a first range in a gate length direction in proximity to the first impurity region.

6. A nonvolatile memory device as described in claim 5, wherein the third gate insulation layer comprises a multiple layer film including a silicon nitride layer disposed between top and bottom silicon oxide layers, the silicon nitride layer of the third gate insulation layer being in contact with the second control gate within a second range in a gate length direction in proximity to the second impurity region.

7. A nonvolatile memory device, comprising:

a first impurity region and a second impurity region each formed in a substrate;

a channel region between the first and second impurity regions;

a word gate formed above the channel region;

a first gate insulation layer between the word gate and the channel region;

a control gate formed to one side of the word gate;

a side insulation layer between the control gate and the word gate; and a second gate insulation layer having a charge trapping region formed between the substrate and the control gate;

wherein the magnitude of an electric field applied in a direction substantially orthogonal relative to the substrate surface between the substrate and the control gate is lower within a first range in a gate length direction adjacent the side insulation layer than it is within a second range in the gate length direction closer to the first impurity region.

8. A nonvolatile memory device, comprising:

a first impurity region and a second impurity region each formed in a substrate;

a channel region between the first and second impurity regions;

a word gate formed above the channel region;

a first gate insulation layer between the word gate and the channel region;

a control gate formed to one side of the word gate;

a side insulation layer between the control gate and the word gate; and a second gate insulation layer having a charge trapping region formed between the substrate and the control gate;

wherein a film of the second gate insulation layer is thicker within a first range in a gate length direction adjacent the side insulation layer than it is within a second range in the gate length direction closer to the first impurity region.

9. A nonvolatile memory device, comprising:

a first impurity region and a second impurity region each formed in a substrate;

a channel region between the first and second impurity regions;

a word gate formed above the channel region;

a first gate insulation layer between the word gate and the channel region;

a control gate formed to one side of the word gate;

a side insulation layer between the control gate and the word gate; and a second gate insulation layer having a charge trapping region formed between the substrate and the control gate;

wherein the second gate insulation layer comprises a multiple layer film including a silicon nitride layer disposed between top and bottom silicon oxide layers, the silicon nitride layer being in contact with the control gate within a range in a gate length direction in proximity to the second impurity region.

10. A nonvolatile memory device, comprising:

a first impurity region and a second impurity region each formed in a substrate;

a channel region between the first and second impurity regions;

a control gate formed above the channel region; and a gate insulation layer between the control gate and the channel region;

wherein the magnitude of an electric field applied in a direction substantially orthogonal relative to the substrate surface between the substrate and control gate is lower within a middle region in the gate length direction of the control gate than it is in regions closer to the first and second impurity regions.

11. A nonvolatile memory device, comprising:

a first impurity region and a second impurity region each formed in a substrate;

a channel region between the first and second impurity regions;

a control gate formed above the channel region; and a gate insulation layer between the control gate and the channel region;

wherein the gate insulation layer comprises a multiple layer film including a silicon nitride layer disposed between top and bottom silicon oxide layers, the silicon nitride layer being in contact with the control gate in proximity to the first and second impurity regions.

* * * * *